United States Patent
Mahon et al.

(10) Patent No.: US 7,045,014 B2
(45) Date of Patent: May 16, 2006

(54) SUBSTRATE SUPPORT ASSEMBLY

(75) Inventors: Christopher Richard Mahon, San Bruno, CA (US); Abhijit Desai, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/423,717

(22) Filed: Apr. 24, 2003

(65) Prior Publication Data

US 2004/0226514 A1 Nov. 18, 2004

(51) Int. Cl.
*B05C 13/00* (2006.01)
*C23C 16/00* (2006.01)

(52) U.S. Cl. .................. 118/500; 118/725; 118/728; 134/1.1

(58) Field of Classification Search .......... 118/724, 118/725, 728, 59, 500, 729; 219/390, 618, 219/634, 638; 156/345.44, 345.52; 279/128; 438/794, 799; 432/152; 134/1.1; 174/6, 174/30, 102 SP
See application file for complete search history.

(56) References Cited

U.S. PATENT DOCUMENTS

| | | | |
|---|---|---|---|
| 5,000,113 A * | 3/1991 | Wang et al. | 118/723 E |
| 5,439,627 A * | 8/1995 | De Jager | 264/129 |
| 5,522,937 A | 6/1996 | Chew et al. | 118/728 |
| 5,633,073 A * | 5/1997 | Cheung et al. | 428/209 |
| 5,792,272 A * | 8/1998 | van Os et al. | 118/723 R |
| 5,983,906 A * | 11/1999 | Zhao et al. | 134/1.1 |
| 6,066,836 A | 5/2000 | Chen et al. | |
| 6,455,781 B1 * | 9/2002 | Tong | 174/111 |
| 2001/0045262 A1 | 11/2001 | Gujer et al. | |

* cited by examiner

*Primary Examiner*—Laura Edwards
(74) *Attorney, Agent, or Firm*—Janah & Associates

(57) ABSTRACT

A substrate support assembly supports a substrate in a process chamber. The substrate support assembly has a support block having an electrode and an arm to hold the support block in the process chamber, the arm having a channel therethrough. The arm has a first clamp to attach to the support block and a second clamp to attach to the process chamber. A plurality of electrical conductors pass through the channel of the arm, and a ceramic insulator is between the conductors.

26 Claims, 3 Drawing Sheets

SUBSTRATE SUPPORT ASSEMBLY

BACKGROUND

Embodiments of the present invention relate to a substrate support assembly for supporting a substrate in a process chamber.

In the manufacture of electronic circuits, such as for example, integrated circuits and displays, a substrate is placed in a process chamber and a process gas is introduced into the chamber to process the substrate. The process chamber generally comprises an enclosure wall surrounding a substrate processing zone. A gas energizer energizes process gas introduced into the chamber by applying RF or microwave energy to the process gas, for example via a microwave applicator, an inductor coil or electrodes arranged about the chamber. The process gas is energized to perform processes such as an etching process to etch features in the substrate or a deposition process to deposit a layer of material on the substrate.

During processing of the substrate in the process chamber, the substrate is held on a substrate support assembly. The substrate support assembly comprises a support having a substrate receiving surface. The assembly can also have an electrode that serves as part of the gas energizer to energize the process gas. The support electrode may also optionally be electrically biased to electrostatically hold the substrate on the support assembly. The assembly can have electrical connectors and conducting structures such as wires or leads. The electrical connectors connect portions of the support assembly to other chamber components or external circuitry. For example, the substrate electrode can have an electrical connector that electrically grounds (ground connector) or provides electrical power (power connector) to the support electrode. The ground connector maintains the support electrode at an electrically grounded potential while a wall electrode in the chamber is electrically biased to energize a gas in the chamber to process the substrate. The ground connector can also dissipate unwanted charge from the support assembly to facilitate removal of the substrate from the support. Another example of an electrically conducting wire is a thermocouple, which is used to monitor temperatures during processing of the substrate. Other connectors can include electrical wires connected to process monitors.

One problem with conventional substrate support assemblies arises when electrical arcing and glow discharges occur between the plasma in the chamber and the connectors and wires in the support. For example, electrical arcing can occur when energized process gas corrodes the insulator coating on a connector or thermocouple. The electrical potential applied to energize the gases in the chamber can also cause glow discharges or micro-arcing. Additionally, when electrically conducting wires pass close to charge carrying wires, back e.m.f. that is induced in the wires can cause arcing and signal cross-talking. Such electrical arcing and glow discharges are undesirable because they damage or "burn" the connectors or wires and adjacent portions of the substrate support. In some plasma environments, degradation of the substrate support assembly and its components can require their refurbishment or replacement after processing of only a relatively small number of substrates, which increases fabrication costs per substrate.

The energized process gases in the chamber can also corrode portions of the substrate support assembly, which eventually leads to contamination of the substrates being processed and failure of the support assembly. For example, energized process gases such as halogen gases can erode metal portions of the support assembly, such as its aluminum portions, requiring frequent cleaning or replacement of these parts.

Thus, it is desirable to have a substrate support assembly that exhibits reduced electrical arcing or glow discharges in a plasma environment. It is also desirable to have a substrate support assembly that allows processing of a large number of substrates without frequent replacement or repair. It is further desirable to be able to easily refurbish or clean the substrate support assembly components.

SUMMARY

A support assembly for supporting a substrate in a process chamber has a support block having an electrode. An arm holds the support block in the process chamber. The arm has a channel therethrough, and has a first clamp to attach to the support block and a second clamp to attach to the process chamber. A plurality of electrical conductors pass through the channel of the arm, and a ceramic insulator is between the conductors.

In another version, a substrate support assembly has a dielectric block having an electrode embedded therein. An arm holds the dielectric block in the process chamber. The arm has a channel therethrough, and has a first clamp to attach to the dielectric block and a second clamp to attach to a portion of the chamber. An electrical ground connector passes through the channel of the arm, the connector having a first terminal to electrically connect to the electrode and a second terminal adapted to electrically ground the electrode. A thermocouple passes through the channel of the arm near the electrical ground connector. A ceramic insulator is between the electrical ground connector and the thermocouple in the channel of the arm.

In another version, a substrate support assembly has a metal block having an anodized metal plate thereon. An arm holds the metal block in the process chamber, the arm having a first clamp to attach to the metal block and a second clamp to attach to a portion of the chamber, the arm having a channel therethrough. An electrical ground connector passes through the channel of the arm, the electrical ground connector having a first terminal to electrically connect to the metal block and a second terminal to electrically ground the metal block. A thermocouple passes through the channel of the arm near the electrical ground connector. A ceramic insulator is between the electrical ground connector and the thermocouple in the channel of the arm.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Figure 1A:
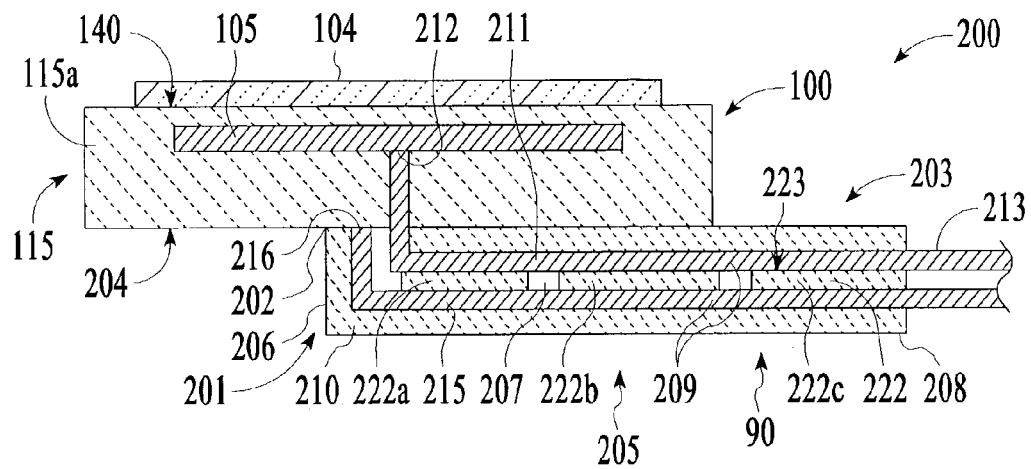
FIG. 1a is a sectional side view of an embodiment of a substrate support assembly comprising a ceramic insulator between a ground connector and a thermocouple in a support arm.
Figure 1B:
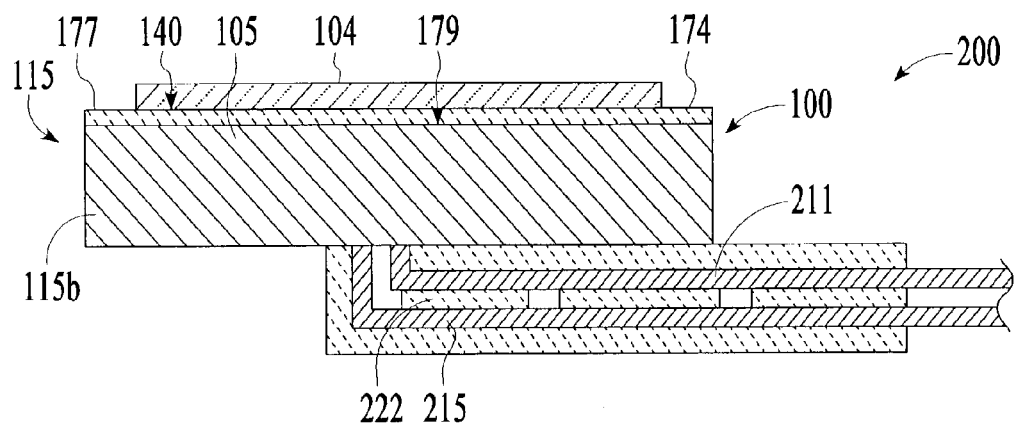
FIG. 1b is a sectional side view of another embodiment of a substrate support assembly comprising a ceramic insulator between a ground connector and a thermocouple in a support arm.
Figure 3:
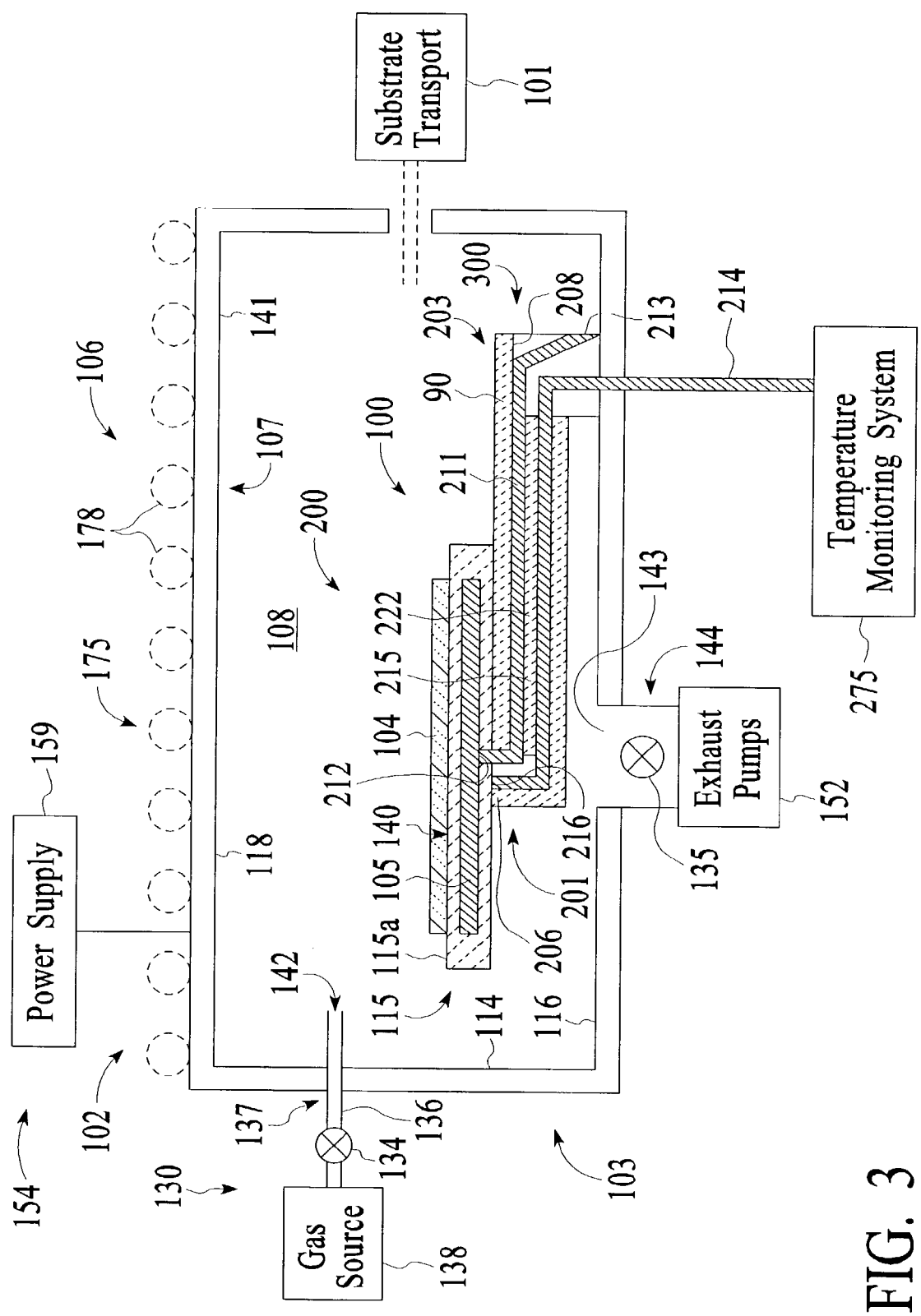
FIG. 3 is partial sectional schematic side view of a version of a chamber having the substrate support assembly according to an embodiment of the present invention

A substrate support assembly 200 comprises a supporting member 100 having a substrate receiving surface 140 to support a substrate 104 in a process chamber 106, as shown in FIGS. 1a, 1b and 3. The supporting member 100 comprises a support block 115 below the substrate receiving surface 140. In one version, as shown in FIG. 1a, the support block 115 comprises a dielectric block 115a formed of dielectric material, such as for example one or more of aluminum nitride, aluminum oxide and silicon oxide. The dielectric block 115a can be, for example, a monolith of dielectric material that is a single unitary structure or can be formed from stacked plates or coatings of dielectric materials. In another version, as shown in FIG. 1b, the support block 115 comprises a metal block 115b that is formed from a suitable metal material, such as for example one or more of aluminum, titanium, nickel and alloys thereof. To inhibit corrosion of the metal block 115b, a layer 177 of corrosion resistant material, such as anodized aluminum material, is provided at the substrate receiving surface 140. For example, an anodized metal plate 174 having a layer 177 of anodized material thereon can be bonded or otherwise attached to the underlying metal block 115b.

The supporting member 100 comprises an electrode 105 that is adapted to act as a part of a gas energizer 154 to energize a process gas provided in the chamber 106 to process the substrate 104. The electrode 105 may also optionally be chargeable to electrostatically hold the substrate 104 on the support assembly 200. In one version, as shown in FIG. 1a and 3, the supporting member 100 comprises an electrode 105 is that is at least partially covered by, or embedded in the dielectric block 115a. The embedded electrode 105 comprises a shape that is suitable to provide the desired electromagnetic characteristics across the supporting member 100. For example, the embedded electrode 105 can comprise a mesh electrode or an electrode plate that is embedded in the dielectric block 115a. The embedded electrode 105 is formed of a suitable conducting material, such as for example molybdenum. In another version, as shown in FIG. 1b, a portion of the metal block 115b serves as the electrode 105 to energize the process gas.

The supporting member 100 can also be adapted to control the temperature of the substrate 104. For example, the support block 115 can have heat transfer fluid conduits formed therein (not shown) to provide temperature control of a substrate 104 being supported thereon. The substrate receiving surface 140 can also have a plurality of raised mesas (not shown) that provide a more uniform distribution of heat across the substrate receiving surface 140 to control the temperature of the substrate 104.

The substrate support assembly 200 further comprises a support arm 90 adapted to hold the supporting member 100 in the process chamber 106. The support arm 90 secures the supporting member 100 by providing a first clamp 206 that connects to the support block 115 and a second clamp 208 that connects to a portion of the process chamber 106, such as a portion of the chamber wall or other portion of the substrate support. In the version shown in FIG. 1, a first end 201 of the support arm 90 comprises a first clamp 206 that is attached to the supporting member 100 at the center 202 of a lower surface 204 of the support block 115. A second end 203 of the support arm 90 comprises a second clamp 208 that secures the supporting member 100 to the chamber 106 by attaching to a portion of the chamber 106, such as the chamber wall 107 or other supporting component. For example, as shown in FIG. 3, the second end 203 of the support arm 90 can be secured to a bellows structure 300 that is adapted to raise and lower the substrate support assembly 200 in the chamber 106 to provide desired plasma processing characteristics. The support arm 90 shown in this figure also supports the supporting member 100 and substrate 104 above an exhaust outlet 143 located in the bottom wall 116 of the chamber 106 underneath the substrate support assembly 200. A support beam section 205 of the support arm 90 extends between the first and second ends 201, 203 to support portions of the supporting member 100 therebetween. The first and second clamps 206, 208 on the ends 201,203 of the support arm 90 are connected to the supporting member 100 and portion of the process chamber 106 by nailing, screwing, gluing, brazing, or other suitable clamping method. The support arm 90 desirably comprises a material that is resistant to corrosion by energized gas to provide a secure and corrosion resistant structure for holding the electrostatic member 100. For example, the support arm 90 can comprise a ceramic material such as at least one of aluminum nitride, aluminum oxide and silicon oxide.

The support arm 90 comprises a hollow support arm portion having a channel 207 therethrough that is sized and shaped to receive a plurality of electrical conductors 209, such as electrical connectors, electrically conducting wires and leads. The channel 207 extends along at least a portion of the support arm 90 to provide an enclosed housing 210 for the conductors 209, for example the channel 207 may extend along substantially the entire length of the support beam section 205 between the connecting support arm ends 202, 203. Electrical conductors 209 such as electrical connectors are routed or passed though the channel 207 in the hollow support arm to guide the conductors 209 from the supporting member 100 to, for example, power supplies, process monitors and chamber components external to the substrate support assembly 200. The housing 210 of the hollow support arm 90 shields and protects the electrical conductors from corrosive energized plasma species to reduce corrosion and electrical arcing.

In one version, the substrate support assembly 200 comprises an electrical conductor 209 comprising an electrical ground connector 211 that is passed through the channel 207 of the hollow support arm 90. The electrical ground connector 211 electrically grounds portions of the supporting member 100, such as the electrode 105, while another electrode 141 in the chamber 106 is electrically biased so that a process gas provided in the chamber 106 can be energized to process the substrate 104. The electrical ground connector 211 can also remove excess electrical charge from portions of the supporting member 100 to facilitate removal of the substrate 104 from the substrate receiving surface 140 after processing. The electrical ground connector 211 comprises a first terminal 212 that is electrically connected to a portion of the supporting member 100, such as the electrode 105 or support block 115, and a second terminal 213 that is adapted to electrically connect to the process chamber 106 to "ground" the electrostatic member, or maintain the electrostatic member 100 at about the same potential as the process chamber 106. FIGS. 1a and 3 show an electrical ground connector 211 comprising a first terminal 212 that is embedded in the dielectric block 115 and electrically connected to the electrode 105, for example by brazing the electrical ground connector 211 to the electrode 105, and a second terminal 213 that is attached and electrically connected to the chamber 106. In FIG. 1b, the first terminal 212 of the electrical ground connector 211 is electrically connected to the metal block 115b comprising the electrode 105, for example by brazing the ground connector 211 to the metal block 115b. The second terminal 213 can be connected to a bottom wall 116 of the chamber 106 at the bottom of the baffle 300, as shown for example in FIG. 3. The electrical ground connector 211 desirably comprises an electrically conductive material, such as for example one or more of stainless steel, nickel, molybdenum, aluminum, hastelloy, and alloys thereof.

The substrate support assembly 200 can also comprise an electrical conductor 209 comprising a thermocouple 215 that is passed through the channel 207 of the hollow support arm 90 near the ground connector 211. FIGS. 1a,b and 2 show a substrate support assembly 200 having at least a portion of the thermocouple 215 routed through the channel 207. The thermocouple 215 is adapted to detect temperatures about the substrate support assembly, such as the temperature of one or more of the substrate 104 and portions of the supporting member 100. The thermocouple 215 generally comprises two or more dissimilar wires, such as metal wires or semiconducting rods, that are welded or otherwise joined together at their ends. Examples of suitable wires include platinum and rhodium, or chromium alloy and aluminum alloy. A difference in temperature between the two ends or junctions generates an e.m.f. having a magnitude that is related to the temperature difference between the junctions. The generated e.m.f. can be measured by a temperature monitoring system 275 comprising a suitable millivoltmeter or potentiometer that is connected to the circuit formed by the wires. In the version shown in FIG. 1, the thermocouple 215 comprises a first tip 216 that is connected or placed adjacent to the support block 115 to detect the temperature of portions of the support block 115, for example by brazing the thermocouple terminal 216 to the bottom surface 204 of the support block 115, and a second tip 214 that is electrically connected to the temperature monitoring system 275.

Figure 2:
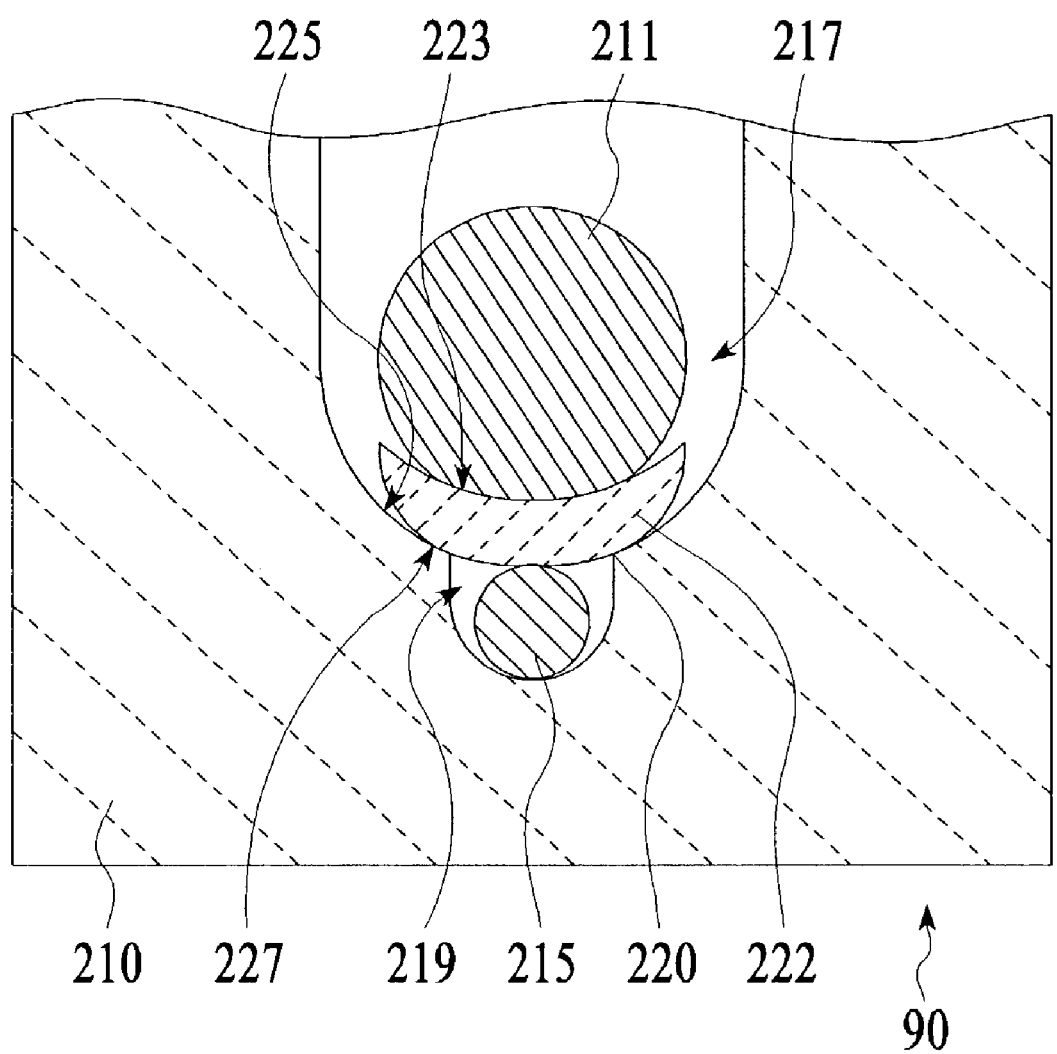
FIG. 2 is a cross-sectional view of a support arm having the ceramic insulator.

FIG. 2 shows a schematic side view of the hollow support arm 90 illustrating an embodiment of an arrangement of the electrical ground connector 211 and thermocouple 215 in the support arm channel 207. In this embodiment, the ground connector 211 and thermocouple 215 are aligned substantially parallel to each other along the long axis of the hollow support arm beam section 205. The ground connector 211 and thermocouple 215 are arranged relatively close to one another to minimize the amount of space required to fit the support arm 90 in the process chamber 106 and to reduce the costs of fabricating the support arm 90. For example, the distance between the ground connector 211 and thermocouple 215 may be less than about 2 inches (about 51 mm), such as for example from about 0.0005 inches (about 0.013 mm) to about 2 inches (about 51 mm), and even less than about 0.001 inches (about 0.025 mm.)

The substrate support assembly 200 further comprises a ceramic insulator 222 positioned in between the electrical ground connector 211 and the thermocouple 215 in the support arm 90, as shown in FIGS. 1a,b and 2. It has been discovered that inserting a ceramic insulator 222 between the closely spaced ground connector 211 and thermocouple 215 can reduce the occurrence of electrical arcing between the ground connector 211 and thermocouple 215, thereby increasing the part life of the substrate support assembly 200. The ceramic insulator 222 comprises a ceramic material that provides sufficient electrical insulation between the ground connector 211 and thermocouple 215. For example, the ceramic insulator 222 may comprise one or more of aluminum nitride, aluminum oxide, zirconium oxide, silicon oxide, silicon carbide, mullite and silicon nitride. The ceramic insulator 222 also desirably comprises a thickness suitable to electrically shield the thermocouple 215 and ground connector 211, such as a thickness of at least about 0.0005 inches (about 0.013 mm) and even at least about 0.001 inches (about 0.025 mm), such as from about 0.001 inches (about 0.025 mm) to about 2 inches (about 51 mm.)

The ceramic insulator 222 is arranged in the channel 207 of the support arm 90 to provide good electrical shielding between the ground connector 211 and thermocouple 215. The ceramic insulator 222 extends along a desired distance in the support arm 90, such as across the length of the support beam section 205 of the support arm 90. For example, the ceramic insulator 222 may extend along at least about 50% of the support beam section 205, and even across substantially the entire support beam section 205. The ceramic insulator 222 can positioned in the channel 207 abutting and even supporting one or more of the ground connector 211 and thermocouple 215. In the version shown in FIGS. 1a,b and 2, the ceramic insulator 222 is positioned underneath the ground connector 211 and has an upper supporting surface 223 that supports the ground connector 211 in the channel 207.

To facilitate the arrangement of the ground connector 211 and thermocouple 215 near on another, and to reduce manufacturing costs, the channel 207 can be formed having differently sized upper and lower grooves 217, 219. The ground connector 211 is positioned above the thermocouple 215 in an upper groove 217 that forms an upper portion of the channel 207, and the thermocouple 215 is positioned below the ground connector 211 in a lower groove 219 that forms a lower portion of the channel 207. The upper groove 217 has a larger width than the lower groove 219 to accommodate a larger width of the ground connector 211. For example, the upper groove 217 may comprise a width of from about 0.005 inches (about 0.13 mm) to about 0.5 inches (about 13 mm.) The lower groove 219 has a smaller width to accommodate the smaller thermocouple 215, such as a width of from about 0.001 inches (about 0.025 mm) to about 0.1 inches (about 2.5 mm.) For ease of manufacture, the opening 220 of the smaller lower groove 219 is sized large enough to allow the thermocouple 215 to be fitted through the opening 220 and into the lower groove 219 during assembly of the substrate support assembly 200. Thus, the channel 207 having the upper and lower grooves 217, 219 with different widths allows for the placement of the ground connector 211 near the thermocouple 215 in the support arm 90 without requiring the time consuming and potentially difficult step of drilling separate channels for the thermocouple 215 and ground connector 211.

The ceramic insulator 222 is sized and shaped to fit in the grooved channel 207 between the ground connector 211 and thermocouple 215. In the version shown in FIG. 2, the ceramic insulator 222 is sized and shaped to rest on the bottom surface 225 of the upper groove 217 between the ground connector 211 and thermocouple 215, and may even be partially supported by the upper surface of the underlying thermocouple 215. The ceramic insulator 222 can also be shaped to at least partially conform to the shape of the overlying ground connector 211. In the version shown in FIG. 2, the ceramic insulator 211 comprises a semi-cylindrical shape having a concave supporting surface 223 that conforms to the cylindrical shape of the ground electrode 211 resting on the insulator 222. The bottom surface 227 of the semi-cylindrical ceramic insulator 222 can also be curved or otherwise molded to fit the shape of the upper groove 217. As an alternative arrangement, the ceramic insulator 222 can be spaced apart from one or more of the ground connector 211 and thermocouple 215 (not shown). The ceramic insulator 222 can also be fitted into the lower groove 219 (not shown), for example in the opening 220 of the lower groove 219, or in another arrangement that suitably places the ceramic insulator 222 between the ground connector 211 and thermocouple 215 to provide electrical shielding.

In one version, the ceramic insulator 222 comprises a single piece of ceramic material that extends continuously along the length of the channel 207, as shown for example in FIG. 3. The single piece of ceramic material provides continuous electrical shielding between the ground connector 211 and thermocouple 215 along the length of the ceramic insulator 222. In another version, the ceramic insulator 222 comprises several strips 222a,b,c of ceramic material spaced apart along a length of the channel 207 between the ground connector 211 and thermocouple 215, as shown for example in FIGS. 1a and b. Providing the ceramic insulator 222 in the form of smaller insulator strips 222a,b,c can reduce costs and improve the ease of manufacture of the ceramic insulator 222 over the fabrication of a single long ceramic insulator piece. The spacing between each of the ceramic insulator strips 222a,b,c is selected to be sufficiently small to maintain the desired electrical shielding between the ground connector 211 and thermocouple 215. For example, the spacing between each of the strips may be less than about 4.5 inches (about 114 mm), such as from about 0.001 inches (about 0.025 mm) to about 4.5 inches (about 114 mm), and even less than about 0.005 inches (about 0.13 mm.) One version of a suitable ceramic insulator 222 comprises about 3 insulator strips 222a,b,c.

The above-described configuration of the substrate support assembly 200 having the ceramic insulator 222 between the ground connector 211 and thermocouple 215 has been discovered to provide good resistance to corrosion in the process chamber 106 by reducing the occurrence of electrical arcing between the ground connector 211 and thermocouple 215 during processing of substrates 104 in the chamber 106. The use of the ceramic insulator 222 also preserves the ease of assembly of the substrate support assembly 200, as the ground connector and thermocouple may be easily routed through the same channel 207, without requiring the drilling of separate channels for each. Thus, the substrate support assembly 200 having the ceramic insulator provides an improved corrosion resistant support component for the processing of substrates 104 in the process chamber 106.

The substrate support assembly 200 also allows for refurbishing of the assembly to provide a longer processing lifetime. The refurbishing process may allow for the cleaning of parts such as the support block 115 and support arm 90 to remove process residues, as well as the replacement of any corroded assembly parts, such as the metal plate 174. As the ceramic insulator 222 inhibits electrical arcing and reduces corrosion of the ground connector 211, the refurbishing process may also be performed without requiring replacement of the ground connector 211. To refurbish the substrate support assembly 200, one or more of the thermocouple 215 and metal plate are removed from the support block 115. A cleaning process is then performed to clean process residues from one or more of the support block 115 and support arm 90. The cleaning process can comprise, for example, immersing the support block 115 and support arm 90 in a cleaning solution comprising acidic or basic species, such as for example HF or KOH, as described for example in U.S. application Ser. No. 10/032,387, to He et al, filed on Dec. 21, 2001, and issued on Dec. 2, 2003 as U.S. Pat. No. 6,656,535, assigned to Applied Materials, and U.S. application Ser. No. 10/304,535, to Wang et al, filed on Nov. 25, 2002, and assigned to Applied Materials, which are herein incorporated by reference in their entireties. The cleaning solution removes any process residues and also can remove any loose grains from the dielectric block 115 and support arm 90 which could otherwise contaminate the substrate 104 during processing. A grit blasting process can also be performed to clean and refurbish the support block 115 and support arm 90, as described in the above-referenced applications. After the cleaning process has been performed, the same or a fresh thermocouple 215 is arranged adjacent to the support block 115, for example by brazing a tip of the thermocouple to the lower surface 204 of the support block 115. In the substrate support assembly embodiment including the metal plate 174, a new metal plate 174 can be applied to the upper surface 179 of the metal block 115. The thermocouple 215 and ground connector 211 are re-routed through the channel of the support arm 90, and the ceramic insulator 222 is placed therebetween.

An apparatus 102 suitable for processing a substrate 104 with the substrate support assembly 200 comprising the hollow support arm 90 with the ceramic insulator comprises a process chamber 106, as shown in FIG. 3. The particular embodiment of the apparatus 102 shown herein is suitable for processing substrates 104, such as semiconductor wafers, and may be adapted by those of ordinary skill to process other substrates 104, such as flat panel displays, polymer panels, or other electrical circuit receiving structures. The apparatus 102 is particularly useful for processing layers, such as etch resistant, silicon-containing, metal-containing, dielectric, and/or conductor layers on the substrate 104.

The apparatus 102 may be attached to a mainframe unit (not shown) that contains and provides electrical, plumbing, and other support functions for the apparatus 102 and may be part of a multichamber system (not shown). The multichamber system has the capability to transfer a substrate 104 between its chambers without breaking the vacuum and without exposing the substrate 104 to moisture or other contaminants outside the multichamber system. An advantage of the multichamber system is that different chambers in the multichamber system may be used for different purposes in the entire process. For example, one chamber may be used for etching a substrate 104, another for the deposition of a metal film, another may be used for rapid thermal processing, and yet another may be used for depositing an anti-reflective layer. The process may proceed uninterrupted within the multichamber system, thereby preventing contamination of substrates 104 that may otherwise occur when transferring substrates 104 between various separate individual chambers for different parts of a process.

Generally, the process chamber 106 comprises a wall 107, such as an enclosure wall 103, which may comprise a ceiling 118, sidewalls 114, and a bottom wall 116 which enclose a process zone 108. In operation, process gas is introduced into the chamber 106 through a gas supply 130 that includes a process gas source 138, and a gas distributor 137. The gas distributor 137 may comprise one or more conduits 136 having one or more gas flow valves 134 and one or more gas outlets 142 around a periphery of the substrate 104 which is held in the process zone 108 on the substrate support assembly 200 having the substrate receiving surface 140. Alternatively, the gas distributor 130 may comprise a showerhead gas distributor (not shown). Spent process gas and etchant byproducts are exhausted from the chamber 106 through an exhaust 144 which may include a pumping channel that receives spent process gas from the process zone via the exhaust outlet 143, a throttle valve 135 to control the pressure of process gas in the chamber 106, and one or more exhaust pumps 152.

The process gas may be energized to process the substrate 104 by a gas energizer 154 that couples energy to the process gas in the process zone 108 of the chamber 106. In the version shown in FIG. 3, the gas energizer 154 comprises process electrodes 105, 141, and a power supply 159 that supplies power to one or more of the electrodes 105, 141 to energize the process gas. The process electrodes 105, 141 may include an electrode 141 that is or is in a wall, such as a sidewall 114 or ceiling 118 of the chamber 106 that is capacitively coupled to another electrode 105, such as the electrode 105 in the substrate support assembly 200 below the substrate 104. In one version, the gas energizer 154 powers an electrode 141 comprising a gas distribution plate that is part of a showerhead gas distributor in the ceiling 118 (not shown.) Alternatively or additionally, the gas energizer 154 may comprise an antenna 175 comprising one or more inductor coils 178 which may have a circular symmetry about the center of the chamber 106. In yet another version, the gas energizer 154 may comprise a microwave source and waveguide to activate the process gas by microwave energy in a remote zone upstream from the chamber 106 (not shown).

To process a substrate 104, the process chamber 106 is evacuated and maintained at a predetermined sub-atmospheric pressure. The substrate 104 is then provided on the substrate receiving surface 140 of the substrate support assembly by a substrate transport 101, such as a robot arm and a lift pin system. The gas energizer 154 then energizes a gas to provide an energized gas in the process zone 108 to process the substrate 104 by coupling RF or microwave energy to the gas. A bellows structure 300 can raise or lower the substrate 104 to provide the desired plasma processing characteristics.

Although exemplary embodiments of the present invention are shown and described, those of ordinary skill in the art may devise other embodiments which incorporate the present invention, and which are also within the scope of the present invention. For example, other support arm structures other than those specifically mentioned may be used. Also, the positions of the ground connector 211 and thermocouple 215 in the support arm 90 can be reversed, or they can be positioned side-by-side, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A support assembly for supporting a substrate in a process chamber, the support assembly comprising:
   (a) a support block comprising an electrode;
   (b) an arm to hold the support block in the process chamber, the arm comprising a first clamp to attach to the support block and a second clamp to attach to the process chamber, and the arm having a channel to pass a plurality of electilcal conductors therethrough, the channel comprising (i) a lower groove sized to pass a first electrical conductor therethrough, and (ii) an upper groove above the lower groove, the upper groove sized to pass a second electrical conductor therethrough;
   (c) a plurality of the electrical conductors passing through the channel of the arm; and
   (d) a ceramic insulator between the conductors, wherein the ceramic insulator extends along at least about 50% of the length of the channel.

2. A support assembly according to claim 1 wherein the plurality of electrical conductors comprises (i) a thermocouple, and (ii) an electrical ground connector.

3. A support assembly according to claim 2 wherein the electrical ground connector and thermocouple are aligned substantially parallel to each other in the channel, and wherein the electrical ground connector and thermocouple comprise a spacing therebetween in the channel of from about 0.013 mm to about 51 mm.

4. A support assembly according to claim 2 wherein the channel comprises (i) the lower groove having a first width that is sized to pass the thermocouple therethrough, and (ii) the upper groove above the lower groove that has a second width that is greater than the first width, the second width being sized to pass the electrical ground connector therethrough, and wherein the ceramic insulator comprises a concave supporting surface that is sized and shaped to support the electrical ground connector above the thermocouple in the upper groove.

5. An assembly according to claim 1 wherein the ceramic insulator comprises one or more of aluminum oxide, zirconium oxide, silicon oxide, silicon carbide, mullite and silicon nitride.

6. An assembly according to claim 1 wherein the ceramic insulator comprises strips that are spaced apart along a length between the plurality of electrical conductors.

7. An assembly according to claim 1 wherein the ceramic insulator comprises a semi-cylindrical shape.

8. An assembly according to claim 7 wherein the ceramic insulator comprises a concave supporting surface to support one or more of the electrical conductors.

9. A process chamber comprising the assembly of claim 1.

10. A method of refurbishing the substrate support assembly of claim 2, the method comprising:
    (a) removing the thermocouple:
    (b) cleaning one or more of the support block and arm by immersing in a cleaning solution;
    (c) arranging a second thermocouple adjacent to the cleaned support block; and
    (d) re-routing the electrical ground connector and thermocouple through the channel in the arm, and positioning the ceramic insulator therebetween.

11. A method according to claim 10 wherein (b) comprises immersing one or more of the support block and arm in a solution comprising acidic or basic species.

12. A method according to claim 10 wherein the substrate support assembly comprises a metal plate on the support block, and wherein (a) further comprises removing the metal plate from the support block, and (b) further comprises attaching a new metal plate to the cleaned support block.

13. A substrate support assembly for supporting a substrate in a process chamber, the assembly comprising:
    a dielectric block having an electrode embedded therein;
    an electrical ground connector comprising a first terminal to electrically connect to the electrode and a second terminal adapted to electrically ground the electrode;
    a thermocouple near the electrical ground connector;
    an arm to hold the dielectric block in the process chamber, the arm having a first clamp to attach to the dielectric block and a second clamp to attach to a portion of the chamber, wherein the arm comprises a channel therethrough to pass the electrical ground connector and thermocouple, the channel comprising (i) a lower groove having a first width that is sized to pass the thermocouple therethrough, and (ii) an upper groove above the lower groove that has a second width that is greater than the first width, the second width being sized to pass the electrical ground connector therethrough; and a ceramic insulator between the electrical ground connector and the thermocouple in the channel of the arm, the ceramic insulator comprising a concave supporting surface that is sized and shaped to support the electrical ground connector above the thermocouple in the upper groove.

14. An assembly according to claim 13 wherein the ceramic insulator comprises one or more of aluminum oxide, zirconium oxide, silicon oxide, silicon carbide, mullite and silicon nitride.

15. An assembly according to claim 13 wherein the ceramic insulator comprises a semi-cylindrical shape.

16. A substrate support assembly for supporting a substrate in a process chamber, the assembly comprising:
a metal block having an anodized metal plate thereon;
an electrical ground connector comprising a first terminal to electrically connect to the metal block and a second terminal adapted to electrically ground the metal block;
a thermocouple near the electrical ground connector;
an arm to hold the metal block in the process chamber, the arm having a first clamp to attach to the metal block and a second clamp to attach to a portion of the chamber, wherein the arm comprises a channel therethrough to pass the electrical ground connector and thermocouple, the channel comprising (i) a lower groove having a first width that is sized to pass the thermocouple therethrough, and (ii) an upper groove above the lower groove that has a second width that is greater than the first width, the second width being sized to pass the electrical ground connector therethrough; and
a ceramic insulator between the electrical ground connector and the thermocouple in the channel of the arm, the ceramic insulator comprising a concave supporting surface that is sized and shaped to support the electrical ground connector above the thermocouple in the upper groove.

17. An assembly according to claim 16 wherein the ceramic insulator comprises one or more of aluminum oxide, zirconium oxide, silicon oxide, silicon carbide, mullite and silicon nitride.

18. An assembly according to claim 16 wherein the ceramic insulator comprises a semi-cylindrical shape.

19. A method of refurbishing a substrate support assembly that supports a substrate in a process chamber,
wherein the support assembly comprises:
(a) a support block comprising an electrode;
(b) an arm, to hold the support block in the process chamber, the arm comprising a first damp to attach to the support block and a second clamp to attach to the process chamber, and the arm having a channel therethrough;

(c) a plurality of electrical conductors passing through the channel of the arm, the electrical conductors comprising (i) a thermocouple, and (ii) an electrical ground connector; and (d) a ceramic insulator between the conductors, and wherein the method of refurbishing the support assembly comprises;
(a) removing the thermocouple;
(b) cleaning one or more of the support block and arm by immersing in a cleaning solution;
(c) arranging a second thermocouple adjacent to the cleaned support block; and
(d) re-routing the electrical ground connector and thermocouple through the channel in the arm, and positioning the ceramic insulator therebetween.

20. A method according to claim 19 wherein (b) comprises immersing one or more of the support block and arm in a solution comprising acidic or basic species.

21. A method according to claim 19 wherein the substrate support assembly comprises a metal plate on the support block, and wherein (a) further comprises removing the metal plate from the support block, and (b) further comprises attaching a new metal plate to the cleaned support block.

22. A support assembly for supporting a substrate in a process chamber, the support assembly comprising:
(a) a support block comprising an electrode;
(b) a plurality of electrical conductors comprising (i) a thermocouple, and (ii) an electrical ground connector;
(c) an arm to hold the support block in the process chamber, the arm comprising a first clamp to attach to the support block and a second clamp to attach to the process chamber, wherein the arm comprises a channel therethrough to pass the plurality of conductors, the channel comprising (i) a lower groove having a first width that is sized to pass the thermocouple therethrough, and (ii) an upper groove above the lower groove that has a second width that is greater than the first width, the second width being sized to pass the electrical ground connector therethrough; and
(d) a ceramic insulator between the conductors, the ceramic insulator comprising a concave supporting surface that is sized and shaped to support the electrical ground connector above the thermocouple in the upper groove.

23. An assembly according to claim 22 wherein the ceramic insulator comprises one or more of aluminum oxide, zirconium oxide, silicon oxide, silicon carbide, mullite and silicon nitride.

24. An assembly according to claim 22 wherein the ceramic insulator comprises strips that are spaced apart along a length between the plurality of electrical conductors.

25. An assembly according to claim 22 wherein the ceramic insulator comprises a semi-cylindrical shape.

26. A process chamber comprising the assembly of claim 22.

* * * * *